US012660574B2

(12) United States Patent
Feng et al.

(10) Patent No.: US 12,660,574 B2
(45) Date of Patent: Jun. 16, 2026

(54) DISPLAY PANEL DETECTED BY DETECTION UNIT AND DISPLAY PANEL MOTHERBOARD

(71) Applicants: Beijing BOE Optoelectronics Technology Co., Ltd., Beijing (CN); BOE Technology Group Co., Ltd., Beijing (CN)

(72) Inventors: Dawei Feng, Beijing (CN); Yu Zhao, Beijing (CN); Yong Zhang, Beijing (CN); Lei Shi, Beijing (CN); Huairui Yue, Beijing (CN); Xian Wang, Beijing (CN); Yang Ge, Beijing (CN); Jianwei Ma, Beijing (CN); Hui Guo, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 370 days.

(21) Appl. No.: 18/282,994

(22) PCT Filed: Jul. 1, 2022

(86) PCT No.: PCT/CN2022/103365
§ 371 (c)(1),
(2) Date: Sep. 19, 2023

(87) PCT Pub. No.: WO2023/005602
PCT Pub. Date: Feb. 2, 2023

(65) Prior Publication Data
US 2024/0178077 A1     May 30, 2024

(30) Foreign Application Priority Data
Jul. 30, 2021     (CN) ......................... 202110871538.X

(51) Int. Cl.
*H10P 74/00*     (2026.01)
*H10D 86/40*     (2025.01)
*H10D 86/60*     (2025.01)

(52) U.S. Cl.
CPC ......... *H10P 74/273* (2026.01); *H10D 86/441* (2025.01); *H10D 86/60* (2025.01)

(58) Field of Classification Search
CPC ...... H01L 22/30–34; G09G 2300/0804; G09G 2300/0876; G09G 3/3266–3291;
(Continued)

(56) References Cited

U.S. PATENT DOCUMENTS

2009/0244429 A1     10/2009     Chung et al.
2010/0308331 A1     12/2010     Chien et al.
(Continued)

FOREIGN PATENT DOCUMENTS

CN     101252136 A     8/2008
CN     101599496 A     12/2009
(Continued)

OTHER PUBLICATIONS

PCT/CN2022/103365 international search report.

*Primary Examiner* — Scott B Geyer
(74) *Attorney, Agent, or Firm* — IPro, PLLC

(57) ABSTRACT

Provided is a display panel. The display panel includes a driver circuit, at least one to-be-detected line, and at least one conductive line in one-to-one correspondence with the at least one to-be-detected line. Any to-be-detected line in the at least one to-be-detected line includes a first sub-line and a second sub-line arranged separating from each other, and another end of the second sub-line is exposed out of an edge of the display panel. The second sub-line is configured (Continued)

to be electrically connected to a detection unit outside the display panel prior to cutting of a display panel motherboard including the display panel.

20 Claims, 8 Drawing Sheets

(58) Field of Classification Search
CPC ......... G09G 2300/0408; H10D 86/441; H10D 86/60; H10D 86/00; H10P 74/273
See application file for complete search history.

(56) References Cited

U.S. PATENT DOCUMENTS

| | | | | |
|---|---|---|---|---|
| 2012/0133870 | A1 | 5/2012 | Park | |
| 2015/0255527 | A1* | 9/2015 | Oooka | G09G 3/006 438/18 |
| 2016/0322451 | A1* | 11/2016 | Park | H10K 71/70 |
| 2016/0379907 | A1* | 12/2016 | Ko | H10D 86/451 257/48 |
| 2018/0102396 | A1* | 4/2018 | Han | H01L 22/30 |
| 2018/0226467 | A1* | 8/2018 | Ka | H01L 22/34 |
| 2019/0109181 | A1* | 4/2019 | Chung | H10K 77/111 |
| 2019/0198582 | A1* | 6/2019 | Yeo | H10K 59/131 |
| 2020/0160766 | A1* | 5/2020 | Ito | H01L 24/16 |
| 2020/0176546 | A1* | 6/2020 | Morita | H10K 59/131 |
| 2020/0243401 | A1* | 7/2020 | Wang | H01L 22/12 |
| 2022/0115280 | A1* | 4/2022 | Du | H01L 22/34 |

FOREIGN PATENT DOCUMENTS

| | | | | | |
|---|---|---|---|---|---|
| CN | 107065363 | A | | 8/2017 | |
| CN | 110556363 | A | * | 12/2019 | ............. H01L 22/32 |
| CN | 111490086 | A | * | 8/2020 | ......... G06F 3/04164 |

* cited by examiner

DISPLAY PANEL DETECTED BY DETECTION UNIT AND DISPLAY PANEL MOTHERBOARD

CROSS-REFERENCE TO RELATED APPLICATION

The present disclosure a U.S. national phase application based on PCT/CN2022/103365, filed on Jul. 1, 2022, which is claims priority to Chinese Patent Application No. 202110871538.X, filed on Jul. 30, 2021, and entitled "DISPLAY PANEL AND DISPLAY PANEL MOTHERBOARD", all of which are hereby incorporated by reference in their entireties for all purposes.

TECHNICAL FIELD

The present disclosure relates to the field of display technologies, and in particular, relates to a display panel and a display panel motherboard.

BACKGROUND

A display panel motherboard may include a plurality of connected display panels, and the display panel motherboard may be cut to acquire separate display panels. At present, a detection unit is usually provided in a peripheral region of a display panel to detect various circuits inside the display panel.

SUMMARY

Embodiments of the present disclosure provide a display panel and a display panel motherboard. The technical solutions are as follows.

According to an aspect of the present disclosure, a display panel is provided. The display panel includes a driver circuit, at least one to-be-detected line, and at least one conductive line in one-to-one correspondence with the at least one to-be-detected line; wherein each of the at least one to-be-detected line includes a first sub-line and a second sub-line arranged separating from each other, wherein the first sub-line is electrically connected to the driver circuit and an conductive line corresponding to the to-be-detected line respectively, one end of the second sub-line is electrically connected to the conductive line corresponding to the to-be-detected line, and another end of the second sub-line is exposed out of an edge of the display panel; and wherein the second sub-line is configured to be electrically connected to a detection unit outside the display panel prior to cutting of a display panel motherboard including the display panel.

Optionally, the conductive line and the first sub-line are located at different layers, and the conductive line and the second sub-line are located at different layers.

Optionally, the display panel includes a base substrate and a first insulating layer disposed on the base substrate; and the at least one to-be-detected line includes a first to-be-detected line, the at least one conductive line includes a first conductive line, wherein the first to-be-detected line and the first conductive line are disposed on two sides of the first insulating layer respectively, a first sub-line and a second sub-line in the first to-be-detected line are located at a same layer, the first sub-line in the first to-be-detected line is electrically connected to the first conductive line through a first via hole in the first insulating layer, and the second sub-line in the first to-be-detected line is electrically connected to the first conductive line through a second via hole in the first insulating layer.

Optionally, the first to-be-detected line is disposed between the first insulating layer and the base substrate, and the first conductive line is disposed on one side, distal from the base substrate, of the first insulating layer.

Optionally, the display panel further includes a second insulating layer, wherein the second insulating layer is disposed between the first insulating layer and the base substrate;

the at least one to-be-detected line further includes a second to-be-detected line, wherein the second to-be-detected line is disposed between the second insulating layer and the base substrate; and a first sub-line and a second sub-line in the second to-be-detected line are located at a same layer, the first conductive line is electrically connected to the first sub-line in the second to-be-detected line through a third via hole in the first insulating layer and the second insulating layer, and the first conductive line is electrically connected to the second sub-line in the second to-be-detected line through a fourth via hole in the first insulating layer and the second insulating layer.

Optionally, the display panel further includes a second insulating layer, wherein the second insulating layer is disposed between the first insulating layer and the base substrate;

the at least one to-be-detected line further includes a second to-be-detected line, wherein the second to-be-detected line is disposed between the second insulating layer and the base substrate, a first sub-line and a second sub-line in the second to-be-detected line are located at a same layer; the to-be-detected line further includes a first transfer line, wherein the first transfer line is disposed between the first insulating layer and the second insulating layer, the first transfer line is electrically connected to the first sub-line in the second to-be-detected line through a fifth via hole in the second insulating layer, and the first transfer line is electrically connected to the first conductive line through a sixth via hole in the first insulating layer; and the at least one to-be-detected line further includes a second transfer line, wherein the second transfer line is electrically connected to the second sub-line in the second to-be-detected line through a seventh via hole in the second insulating layer, and the second transfer line is electrically connected to the first conductive line through an eighth via hole in the first insulating layer.

Optionally, the display panel further includes a second insulating layer, wherein the second insulating layer is disposed between the first insulating layer and the base substrate;

the at least one to-be-detected line further includes a second to-be-detected line, wherein the second to-be-detected line is disposed between the second insulating layer and the base substrate, and a first sub-line and a second sub-line in the second to-be-detected line are located at a same layer; and the at least one conductive line further includes a second conductive line, wherein the second conductive line is disposed on one side, distal from the base substrate, of the second insulating layer, and the second conductive line is electrically connected to the first sub-line in the second to-be-detected line through a ninth via hole in the second insulating layer and is also electrically connected to the second sub-line in the second to-be-detected line through a tenth via hole in the second insulating layer.

Optionally, the first conductive line is electrically connected to the first sub-line in the first to-be-detected line through at least two via holes in the first insulating layer.

Optionally, a material of the first conductive line includes a transparent non-metallic conductive material.

Optionally, the display panel includes a pixel electrode, wherein the first conductive line and the pixel electrode are located at a same layer.

According to another aspect of the present disclosure, a display panel motherboard is provided. The display panel motherboard includes at least one display panel and a to-be-cut plate disposed outside the display panel; wherein the display panel includes a driver circuit, at least one to-be-detected line, and at least one conductive line in one-to-one correspondence with the at least one to-be-detected line;

each of the at least one to-be-detected line includes a first sub-line and a second sub-line arranged separating from each other, wherein the first sub-line is electrically connected to the driver circuit and the conductive line corresponding to the to-be-detected line respectively, and one end of the second sub-line is electrically connected to the conductive line corresponding to the to-be-detected line; and the to-be-cut plate is provided with a detection unit and at least one detection line electrically connected to the detection unit, wherein the at least one detection line is in one-to-one correspondence with the at least one to-be-detected line, and another end of the second sub-line is electrically connected to a detection line corresponding to the to-be-detected line.

Optionally, the display panel includes a base substrate and a first insulating layer disposed on the base substrate;

the at least one to-be-detected line includes a first to-be-detected line, the at least one conductive line includes a first conductive line, wherein the first to-be-detected line and the first conductive line are disposed on two sides of the first insulating layer respectively, a first sub-line and a second sub-line in the first to-be-detected line are located at a same layer, the first sub-line in the first to-be-detected line is electrically connected to the first conductive line through a first via hole in the first insulating layer, and the second sub-line in the first to-be-detected line is electrically connected to the first conductive line through a second via hole in the first insulating layer;

the at least one detection line includes a first detection line, wherein the first detection line corresponds to the first to-be-detected line, and the first to-be-detected line includes a data line; and the display panel motherboard further includes a switch unit, wherein the first detection line is electrically connected to the switch unit, and the switch unit is electrically connected to the detection unit.

Optionally, the display panel further includes a second insulating layer, wherein the second insulating layer is disposed between the first insulating layer and the base substrate;

the at least one to-be-detected line further includes a second to-be-detected line, wherein the second to-be-detected line is disposed between the second insulating layer and the base substrate;

a first sub-line and a second sub-line in the second to-be-detected line are located at a same layer, the first conductive line is electrically connected to the first sub-line in the second to-be-detected line through a third via hole in the first insulating layer and the second insulating layer, and the first conductive line is electrically connected to the second sub-line in the second to-be-detected line through a fourth via hole in the first insulating layer and the second insulating layer;

the at least one detection line includes a second detection line, wherein the second detection line corresponds to the second to-be-detected line, and the second to-be-detected line includes a gate driver signal line; and the second detection line is electrically connected to the detection unit.

Optionally, the switch unit is disposed in the to-be-cut plate.

Optionally, the display panel is provided with an active area and a peripheral region surrounding the active area, and a fanout region is provided in the peripheral region between a first edge of the active area and a second edge of the display panel; and the switch unit and the detection unit are disposed in the to-be-cut plate outside a third edge of the display panel, wherein the third edge is an edge opposite to the second edge;

Optionally, the display panel is provided with an active area and a peripheral region surrounding the active area, and a fanout region is provided in the peripheral region between a first edge of the active area and a second edge of the display panel; and the switch unit and the detection unit are disposed in the to-be-cut plate outside the second edge of the display panel.

Optionally, the display panel is provided with an active area and a peripheral region surrounding the active area, wherein the peripheral region outside a first edge of the active area is provided with a fanout region, the switch unit is disposed in the peripheral region outside a fourth edge of the active area, wherein the fourth edge is an edge opposite to the first edge.

Optionally, the display panel is provided with an active area and a peripheral region surrounding the active area, and a fanout region is provided in the peripheral region between a first edge of the active area and a second edge of the display panel; the detection unit includes two detection sub-units, wherein the two detection sub-units are respectively disposed in the to-be-cut plate outside two ends of a second edge.

BRIEF DESCRIPTION OF THE DRAWINGS

For clearer descriptions of the technical solutions according to the embodiments of the present disclosure, the drawings required to be used in the description of the embodiments are briefly introduced below. It is obvious that the drawings in the description below are only some embodiments of the present disclosure, and it is obvious for person of ordinary skill in the art that other drawings can be obtained according to the drawings without creative efforts.

The above drawings have shown the explicit embodiments of the present disclosure, which will be described below in detail. These drawings and text descriptions are not intended to limit the scope of the conception of the present disclosure in any way, but to illustrate the concept of the present disclosure to those skilled in the art with reference to specific embodiments.

DETAILED DESCRIPTION

For clearer descriptions of the objects, technical solutions, and advantages of the present disclosure, the implementations of the present disclosure are further described in detail below with reference to the drawings.

Figure 1:
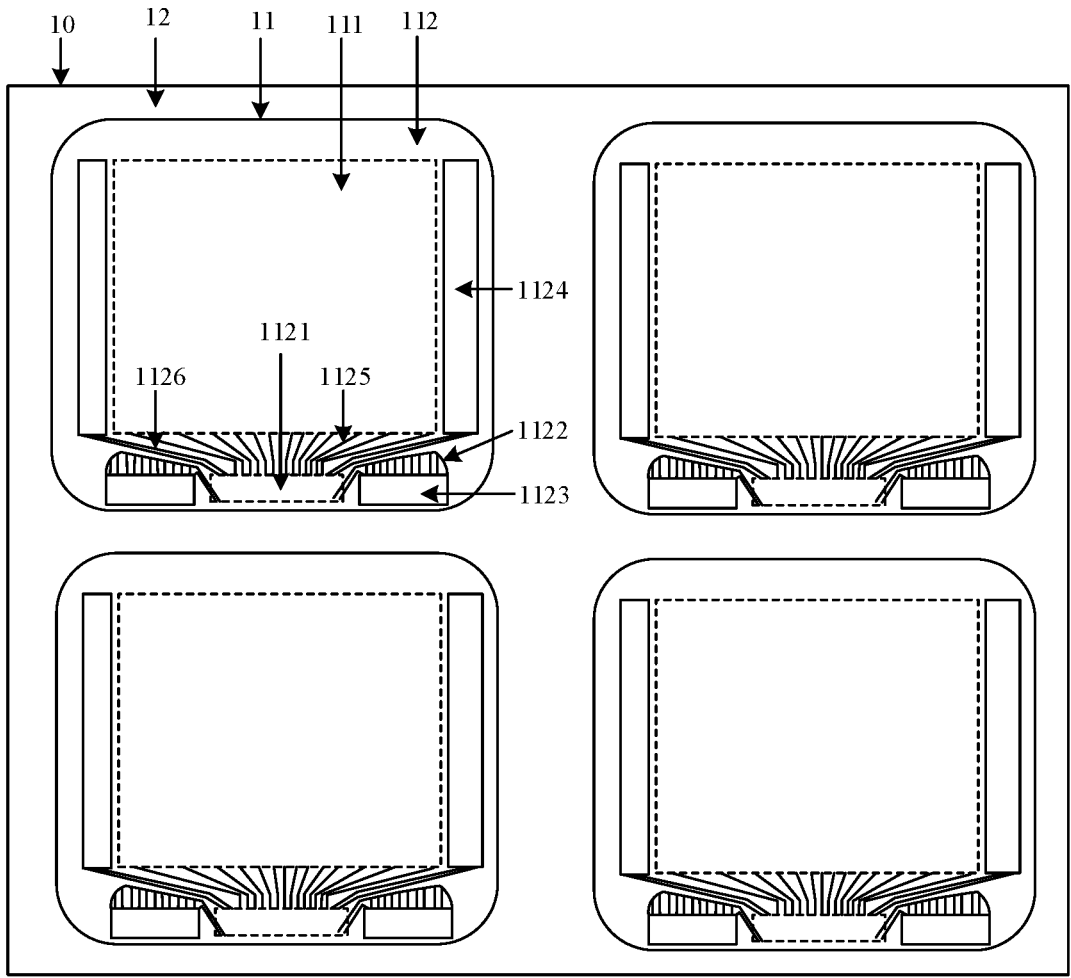
FIG. 1 is a schematic structural diagram of a display panel motherboard.

FIG. 1 is a schematic structural diagram of a display panel motherboard. As shown in FIG. 1, the display panel motherboard includes a display panel. The display panel motherboard 10 includes the display panel 11 and a to-be-cut plate 12 disposed at the periphery of the display panel 11, and a plurality of display panels 11 may be simultaneously manufactured on the display panel motherboard. The display panel 11 includes an active area (AA) 111 and a peripheral region 112 surrounding the active area 111. The peripheral region 112 includes a data line 1125 and a gate control signal line 1126 which are disposed on a fanout region. The peripheral region 112 further includes an integrated circuit (IC) chip region 1121 disposed on one side of the fanout region, an outer lead bonding (OLB) 1122, and two flexible printed circuits (FPC) 1123, and the two flexible printed circuits 1123 are respectively disposed on two sides of the IC chip region 1121. The IC chip region 1121 is configured for the subsequent placement of the IC chip.

The peripheral region 112 further includes gate drivers on array (GOA) 1124 on two sides of the active area 111.

In the related art, upon manufacturing of the display panel motherboard, defect detection needs to be performed on the display panel motherboard, and the defect detection includes an electric test (ET). Then the display panel motherboard is cut to be manufactured into the display panel. Detection units are usually disposed on two sides of the IC chip region 1121 on the display panel 11.

However, the display panel 11 in the display panel motherboard 10 may be a special-shaped screen. The special-shaped screen is different from the appearance of a rectangular screen of a conventional display panel. The special-shaped screens may include polygonal screens with large chamfers and circular screens. The peripheral region of the special-shaped screen is generally narrow.

As an area of the fanout region side of the peripheral region 112 is small, the display panel 11 cannot set a position for placing the detection unit, and thus defect detection cannot be performed on the display panel motherboard in the manufacturing process.

Alternatively, the data line and the gate control signal line in the display panel are directly connected to an external detection unit in the manufacturing process to perform detection. However, upon the display panel motherboard being cut into the display panel, the data line and the gate control signal line are exposed out of the edge of the display panel and then are easily corroded by external environments, and corrosion on the data line and the gate control signal line extends into the display panel along the to-be-detected line, causing the poor display effect of the display panel.

Embodiments of the present disclosure provide a display panel and a display panel motherboard, which can solve the problems in the related art described above.

Figure 2:
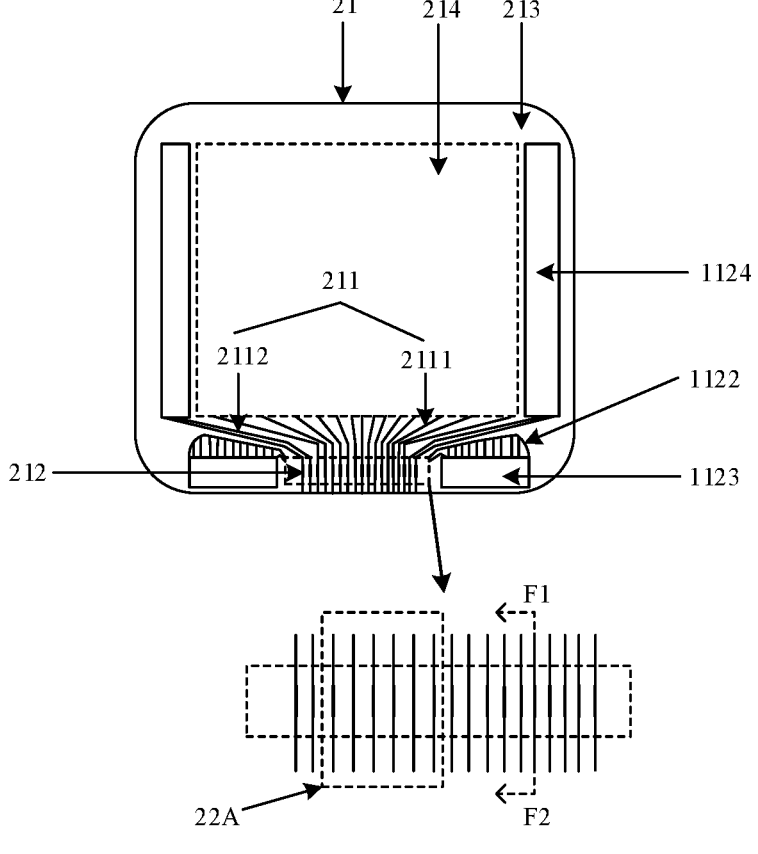
FIG. 2 is a schematic structural diagram of a display panel according to some embodiments of the present disclosure.
Figure 3:
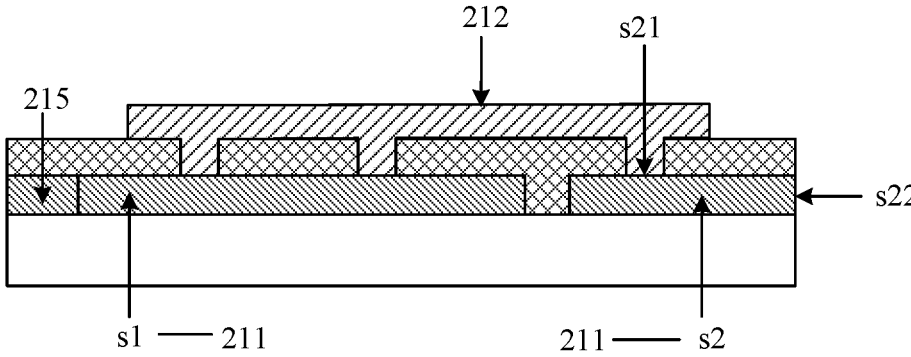
FIG. 3 is a schematic cross-sectional diagram of the display panel shown in FIG. 2 along a connection line F1-F2.

FIG. 2 is a schematic structural diagram of a display panel according to some embodiments of the present disclosure. FIG. 3 is a schematic cross-sectional diagram of the display panel shown in FIG. 2 along a connection line F1-F2. Referring to FIG. 2 and FIG. 3, the display panel 21 includes a driver circuit (not shown in FIG. 2), at least one to-be-detected line 211, and at least one conductive line 212 in one-to-one correspondence with the at least one to-be-detected line 211. The conductive line 212 may be an anti-corrosion conductive line. The display panel 21 is provided with an active area 214 and a peripheral region 213 surrounding the active area 214, and the driver circuit is disposed on the active area 214 and the peripheral region 213 of the display panel 21. The driver circuit may be a circuit structure in the display panel 21 electrically connected to a light-emitting device in the display panel 21 and used to drive the light-emitting device to emit light.

Each of the at least one to-be-detected line 211 includes a first sub-line s1 and a second sub-line s2 arranged separating from each other. The first sub-line s1 and the second sub-line s2 may be spaced apart in an extension direction of either of the first sub-line s1 and the second sub-line s2, or alternatively, the first sub-line s1 and the second sub-line s2 may be disconnected. The first sub-line s1 is electrically connected to a conductive line 212 corresponding to the to-be-detected line 211 and the driver circuit 215. One end s21 of the second sub-line s2 is electrically connected to the conductive line 212 corresponding to the to-be-detected line 211.

The second sub-line s2 is configured to be electrically connected to a detection unit outside the display panel 21 prior to cutting of the display panel motherboard. The detection unit is configured to perform defect detection on the display panel 21.

In the subsequent steps of manufacturing the display panel, the display panel may be cut out from the display panel motherboard to be acquired. Upon cutting of the display panel motherboard along the edge of the display panel, as another end s22 of the second sub-line s2 is electrically connected to the detection unit outside the display panel, another end s22 of the second sub-line s2 is exposed at the edge of the display panel.

The conductive line 212 is not easy to corrode, such that corrosion caused by the second sub-line s2 exposed out of the edge of the display panel 21 can be prevented from extending to the inside of the display panel 21.

In summary, the display panel is provided in the embodiments of the present disclosure. The display panel includes the driver circuit, the at least one to-be-detected line, and the at least one conductive line in one-to-one correspondence with the at least one to-be-detected line. For any to-be-detected line in the at least one to-be-detected line, the to-be-detected line includes the first sub-line and the second sub-line arranged separating from each other, and another end of the second sub-line is exposed out of the edge of the display panel. The second sub-line is configured to be electrically connected to the detection unit outside the display panel prior to cutting of the display panel motherboard. Therefore, the display panel is electrically connected to the detection unit outside the display panel through the second sub-line, such that defect detection is performed on the display panel, and the first sub-line and the second sub-line in the to-be-detected line are electrically connected through the conductive line. The conductive line can prevent corrosion of the second sub-line exposed out of the edge of the display panel from extending to the inside of the display panel. The problem that display panels with faults are difficult to detect in the related art can be solved, and the detection effect of the display panel is improved.

Optionally, as shown in FIG. 3, the conductive line 212 and the first sub-line s1 are located at different layers, and the conductive line 212 and the second sub-line s2 are located at different layers. The first sub-line s1 and the second sub-line s2 are further isolated by the cross-layer conductive line 212, and then the anti-corrosion performance can be further improved.

Figure 4:
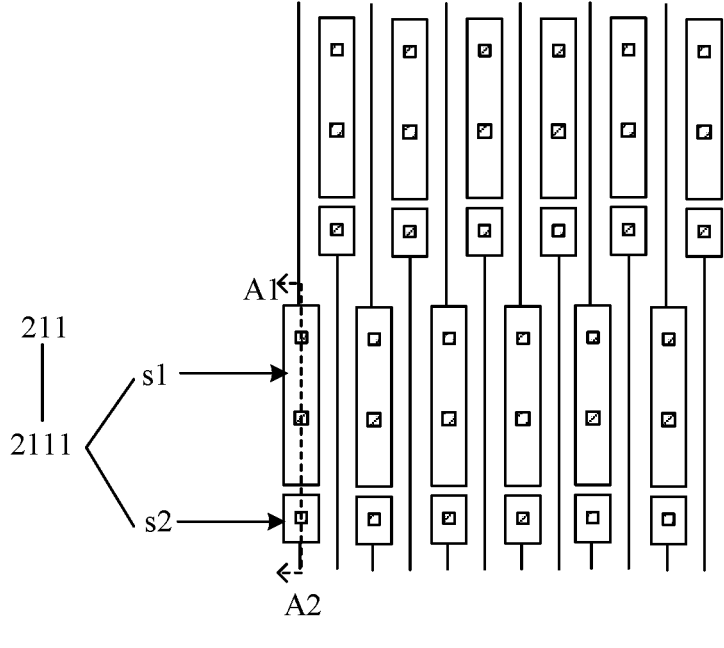
FIG. 4 is a partial schematic structural diagram of the display panel shown in FIG. 2.

Further, FIG. 4 is a schematic structural diagram of a part 22A of the display panel shown in FIG. 2. As shown in FIG. 4, in the subsequent manufacturing process of the display panel, an IC chip is provided, and includes pins. The pins of the IC chip are matched with the conductive line (in order to clearly show), such that the IC chip is electrically connected to the first sub-line s1 in the to-be-detected lines 211 through the conductive line 212, and further electrically connected to the driver circuit. The first sub-line s1 in the to-be-detected line 211 is disposed in a gap between the pins of the IC chip, which can further save space on the display panel. In order to clearly show the structure of the to-be-detected lines 211, 212 is not shown in FIG. 4, which is not limited by embodiments of the present application.

Figure 5:
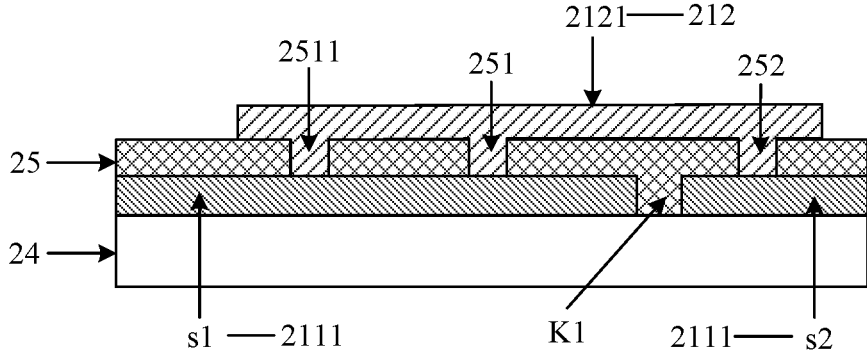
FIG. 5 is a schematic cross-sectional structural diagram of the display panel shown in FIG. 4 along a connection line A1-A2.

In some alternative embodiments, as shown in FIG. 5, FIG. 5 is a schematic cross-sectional structural diagram of the display panel shown in FIG. 4 along a connection line A1-A2. The display panel includes a base substrate 24 and a first insulating layer 25 disposed on the base substrate 24. The first insulating layer 25 is a passivation layer (PVX).

The at least one to-be-detected line includes a first to-be-detected line 2111, and the first to-be-detected line 2111 is a data line (Data) on the display panel, and configured to provide a data signal for the driver circuit on the display panel. The display panel further includes a source-drain (SD) metal pattern. The first to-be-detected line 2111 and the source-drain metal pattern are located at the same layer.

The at least one conductive line 212 includes a first conductive line 2121, the first to-be-detected line 2111 and the first conductive line 2121 are disposed on two sides of the first insulating layer 25 respectively, and a first sub-line s1 and a second sub-line s2 in the first to-be-detected line 2111 are located at the same layer. A disconnection hole K1 is provided between the first sub-line s1 and the second sub-line s2 in the first to-be-detected line 2111.

The first sub-line s1 in the first to-be-detected line s1 is electrically connected to the first conductive line 2121 through a first via hole 251 in the first insulating layer 25. The second sub-line s2 is electrically connected to the first conductive line 2121 through a second via hole 252 in the first insulating layer 25. The first sub-line s1 in the first to-be-detected line 2111 is connected to the driver circuit. One end, distal from the first sub-line s1, of the second sub-line s2 is exposed out of an edge of the display panel, and the exposed portion is easy to corrode.

In this way, the first sub-line s1 and the second sub-line s2 in the first to-be-detected line 2111 are electrically connected through the first conductive line 2121. The first conductive line 2121 can prevent corrosion caused by the second sub-line s2 exposed out of the edge of the display panel from extending to the first sub-line s1, and can further prevent corrosion from extending to the driver circuit. In addition, the first conductive line 2121 can prevent static electricity attracted by the second sub-line s2 exposed out of the edge of the display panel from extending to the first sub-line s1, and can further prevent the static electricity from extending to the driver circuit.

In addition, an anisotropic conductive film (ACF) is provided between the first conductive line and the pins of the IC chip, and the anisotropic conductive film is a thin film in which conductive particles are dispersed in an insulating adhesive and is configured to electrically connect the pins of the IC chip to the first conductive line. Meanwhile, the anisotropic conductive film can protect the first conductive line, and can avoid corrosion caused by exposure of a via hole on one side, proximal to the base substrate, of the first conductive line.

In an alternative example, as shown in FIG. 5, the first to-be-detected line 2111 is disposed between the first insulating layer 25 and the base substrate 24, and the first conductive line 2121 is disposed on one side, distal from the base substrate 24, of the first insulating layer 25.

In addition, the first to-be-detected line may be disposed on one side, distal from the base substrate, of the first insulating layer, and the first conductive line may be disposed on one side, proximal to the base substrate, of the first insulating layer. The first sub-line in the first to-be-detected line is electrically connected to the first conductive line through the via hole in the first insulating layer. The second sub-line is electrically connected to the first conductive line through the via hole in the first insulating layer. This is not limited in the embodiments of the present disclosure herein.

Figure 6:
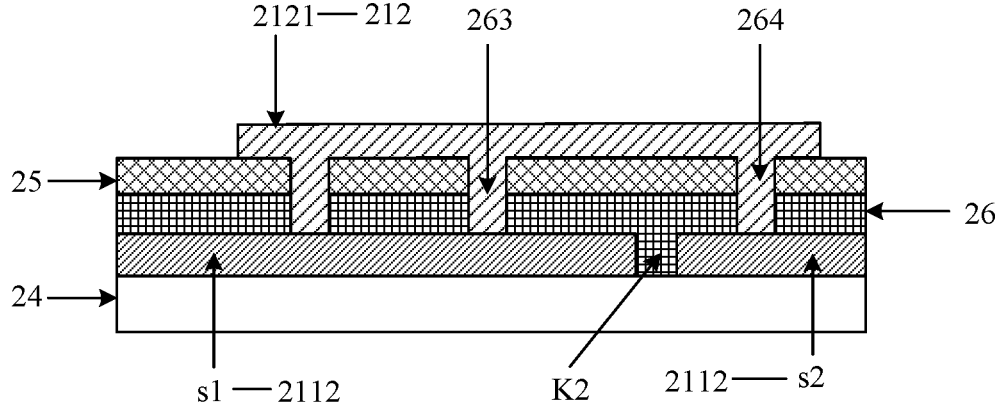
FIG. 6 is a partial cross-sectional schematic structural diagram of another display panel according to some embodiments of the present disclosure.

In an alternative implementation, as shown in FIG. 6, FIG. 6 is a partial cross-sectional schematic structural diagram of another display panel according to some embodiments of the present disclosure. The display panel further includes a second insulating layer 26, and the second insulating layer 26 is disposed between the first insulating layer 25 and the base substrate 24. The second insulating layer 26 is a gate insulator (GI).

The at least one to-be-detected line further includes a second to-be-detected line 2112. The second to-be-detected line 2112 is a gate driver signal line, and the gate driver signal line is connected to a gate driver on array on the display panel. The gate driver on array (GOA) includes a plurality of gate driver units, each gate driver unit includes a plurality of thin film transistors (TFTs), wherein each gate driver unit corresponds to one row of gate lines, that is, an output end of each gate driver unit is connected to one row of gate lines, the gate driver units provide a gate driver signal for the driver circuit on the display panel, and the GOA is electrically connected to the driver circuit.

The second to-be-detected line 2112 is disposed between the second insulating layer 26 and the base substrate 24. A first sub-line s1 and a second sub-line s2 in the second to-be-detected line 2112 are located at the same layer. The display panel further includes a gate metal pattern, and the first sub-line s1 and the second sub-line s2 in the second to-be-detected line 2112 and the gate metal pattern are located at the same layer.

A disconnection hole K2 is provided between the first sub-line s1 and the second sub-line s2 in the second to-be-detected line 2112.

The first conductive line 2121 is electrically connected to the first sub-line s1 in the second to-be-detected line 2112 through a third via hole 263 in the first insulating layer 25 and the second insulating layer 26, and the first conductive line 2121 is electrically connected to the second sub-line s2 in the second to-be-detected line 2112 through a fourth via hole 264 in the first insulating layer 25 and the second insulating layer 26. The first sub-line s1 in the second to-be-detected line 2112 is connected to the driver circuit. One end, distal from the first sub-line s1, of the second sub-line s2 is exposed out of the edge of the display panel, and the exposed portion is easy to corrode.

In this way, the first sub-line s1 and the second sub-line s2 in the second to-be-detected line 2112 are electrically connected through the first conductive line 2121. The first conductive line 2121 can prevent corrosion caused by the second sub-line s2 exposed out of the edge of the display panel from extending to the first sub-line s1, and thus can further prevent corrosion from extending to the driver circuit. In addition, the first conductive line 2121 can prevent static electricity attracted by the second sub-line s2 exposed out of the edge of the display panel from extending to the first sub-line s1, and can further prevent the static electricity from extending to the driver circuit.

Figure 7:
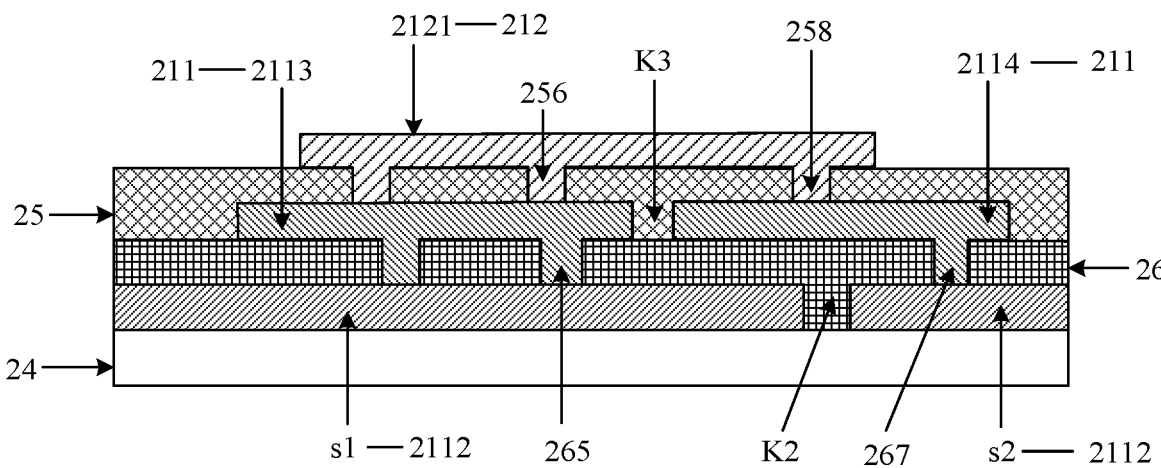
FIG. 7 is a partial cross-sectional schematic structural diagram of another display panel according to some embodiments of the present disclosure.

Optionally, as shown in FIG. 7, FIG. 7 is a partial cross-sectional schematic structural diagram of another display panel according to some embodiments of the present disclosure. The to-be-detected line 211 further includes a first transfer line 2113 and a second transfer line 2114 arranged separating from each other, and the first transfer line 2113 is disposed between the first insulating layer 25 and the second insulating layer 26, for example, the first transfer line 2113 and the source-drain metal pattern are located at the same layer. The first transfer line 2113 is electrically connected to the first sub-line s1 in the second to-be-detected line 2112 through a fifth via hole 265 in the second insulating layer 26. The first sub-line s1 in the second to-be-detected line 2112 is connected to the driver circuit.

In addition, the first transfer line 2113 is electrically connected to the first sub-line s1 in the second to-be-detected line 2112 through two or more via holes in the second insulating layer 26, so as to increase the stability of the electrical connection.

The first transfer line 2113 is electrically connected to the first conductive line 2121 through a sixth via hole 256 in the first insulating layer 25. A plurality of insulating layers are provided between the first conductive line 2121 and the second to-be-detected line 2112, and the first transfer line 2113 is arranged to connect the first conductive line 2121 to the first sub-line s1 of the second to-be-detected line 2112, such that unstable electrical connection caused by overlong via holes can be avoided.

In addition, the first transfer line 2113 is also electrically connected to the first conductive line 2121 through two or more via holes in the first insulating layer 25. On the one hand, the stability of the electrical connection can be increased, and on the other hand, the resistance of the first conductive line 2121 in a direction parallel to the base substrate 24 can be reduced.

The to-be-detected line 211 further includes a second transfer line 2114, the second transfer line 2114 is electrically connected to the second sub-line s2 in the second to-be-detected line 2112 through a seventh via hole 267 in the second insulating layer 26, and the second transfer line 2114 is electrically connected to the first conductive line 2121 through an eighth via hole 258 in the first insulating layer 25. One end, distal from the first sub-line s1, of the second sub-line s2 is exposed out of the edge of the display panel, and the exposed portion is easy to corrode.

The first transfer line 2113 and the second transfer line 2114 are arranged separating from each other, that is, the first transfer line 2113 and the second transfer line 2114 are disconnected from each other, and a disconnection hole K3 is provided therebetween.

In this way, the first sub-line s1 and the second sub-line s2 in the second to-be-detected line 2112 are electrically connected through the first transfer line 2113, the first conductive line 2121, and the second transfer line 2114. The first conductive line 2121 can prevent corrosion caused by the second sub-line s2 exposed out of the edge of the display panel from extending to the first sub-line s1, and can further prevent corrosion from extending to the driver circuit. In addition, the first conductive line 2121 can prevent static electricity attracted by the second sub-line s2 exposed out of the edge of the display panel from extending to the first sub-line s1, and can further prevent the static electricity from extending to the driver circuit.

Figure 8:
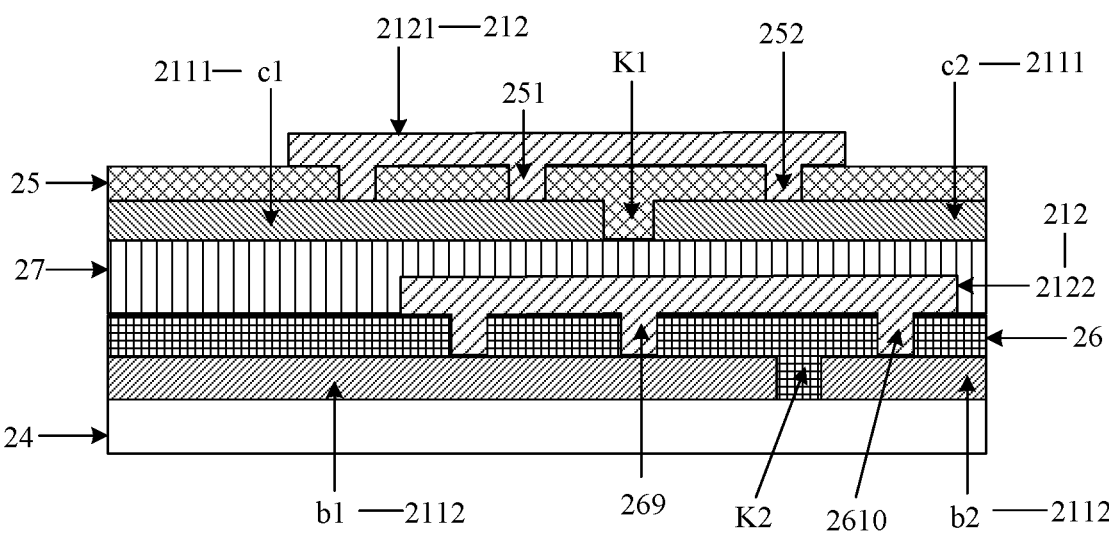
FIG. 8 is a partial cross-sectional schematic structural diagram of another display panel according to some embodiments of the present disclosure.

Optionally, as shown in FIG. 8, FIG. 8 is a partial cross-sectional schematic structural diagram of another display panel according to some embodiments of the present disclosure. The conductive line 212 further includes a second conductive line 2122, and the second conductive line 2122 is disposed on one side, distal from the base substrate 24, of the second insulating layer 26. The display panel further includes a third insulating layer 27, and the third insulating layer 27 is disposed on one side, distal from the base substrate 24, of the second conductive line 2122.

The second conductive line 2122 is electrically connected to the first sub-line b1 of the second to-be-detected line 2112 through a ninth via hole 269 in the second insulating layer 26, and is also electrically connected to the second sub-line b2 of the second to-be-detected line 2112 through a tenth via hole 2610 in the second insulating layer 26. The first sub-line b1 and the second sub-line b2 in the second to-be-detected line 2112 are disconnected from each other, and a disconnection hole K2 is provided therebetween.

In this way, the first sub-line b1 and the second sub-line b2 in the second to-be-detected line 2112 are electrically connected through the second conductive line 2122. The second conductive line 2122 can prevent corrosion caused by the second sub-line b2 exposed out of the edge of the display panel from extending to the first sub-line b1, and thus can further prevent corrosion from extending to the driver circuit. In addition, the second conductive line 2122 can prevent static electricity attracted by the second sub-line s2 exposed out of the edge of the display panel from extending to the first sub-line s1, and thus can prevent the static electricity from extending to the driver circuit. In addition, the structure of the first sub-line c1 and the second sub-line c2 in the first to-be-detected line 2111 in FIG. 8 can be referred to the above embodiments, which will not be repeated in the embodiments of the present application.

Optionally, as shown in FIG. 5, the first conductive line 2121 is electrically connected to the first sub-line s1 of the first to-be-detected line 2111 through at least two first target via holes in the first insulating layer 25. Exemplarily, the at least two target via holes may include the first via hole 251 and a eleventh via hole 2511. It should be noted that FIG. 5 shows only a case where the first sub-line s1 of the first to-be-detected line 2111 and the first conductive line 2121 are electrically connected through the first via hole 251 and the eleventh via hole 2511 in the first insulating layer 25. The first conductive line 2121 is also electrically connected to the first sub-line s1 of the first to-be-detected line 2111 through more first target via holes in the first insulating layer 25. This is not limited in the embodiments of the present disclosure.

In this way, a contact area of the first conductive line 2121 and the first sub-line s1 of the first to-be-detected line 2111 can be increased. Therefore, on the one hand, the connection stability of the first conductive line 2121 and the first sub-line s1 of the first to-be-detected line 2111 can be enhanced. On the other hand, the horizontal resistance of the first conductive line 2121 in the direction parallel to the base substrate 11 can be reduced.

Similarly, as shown in FIG. 6, the first conductive line 2121 is electrically connected to the first sub-line s1 of the second to-be-detected line 2112 through at least two second target via holes in the first insulating layer 25 and the second insulating layer 26.

Exemplarily, the at least two second target via holes may include the third via hole 263 and a twelfth aperture 2631. It should be noted that FIG. 6 only illustrates that the first sub-line s1 of the second to-be-detected line 2112 and the first conductive line 2121 may be electrically connected through the third via hole 263 and the twelfth via hole 2631 in the first insulating layer 25 and the second insulating layer 26. The first conductive line 2121 may also be electrically connected to the first sub-line s1 of the second to-be-detected line 2112 through more second target via holes in the first insulating layer 25 and the second insulating layer 26. This is not limited in the embodiments of the present disclosure.

As shown in FIG. 7, the first conductive line 2121 is electrically connected to the first transfer line 2113 through at least two third target via holes in the first insulating layer 25. The at least two third target via holes include the sixth via hole 256.

As shown in FIG. 8, the second conductive line 2122 is electrically connected to the first sub-line s1 of the second to-be-detected line 2112 through at least two fourth target via holes in the second insulating layer 26. The at least two fourth target via holes include the fifth via hole 265.

Optionally, as shown in FIG. 8, a material of the first conductive line 2121 includes a transparent non-metallic conductive material, which is indium tin oxide (ITO). A material of the second conductive line 2122 is the same as the material of the first conductive line 2121.

Optionally, the display panel includes a pixel electrode, and the first conductive line and the pixel electrode are located at the same layer. Therefore, the first conductive line and the pixel electrode are formed through a one-time patterning process in the process of manufacturing the display panel, and manufacturing procedures can be saved.

Figure 9:
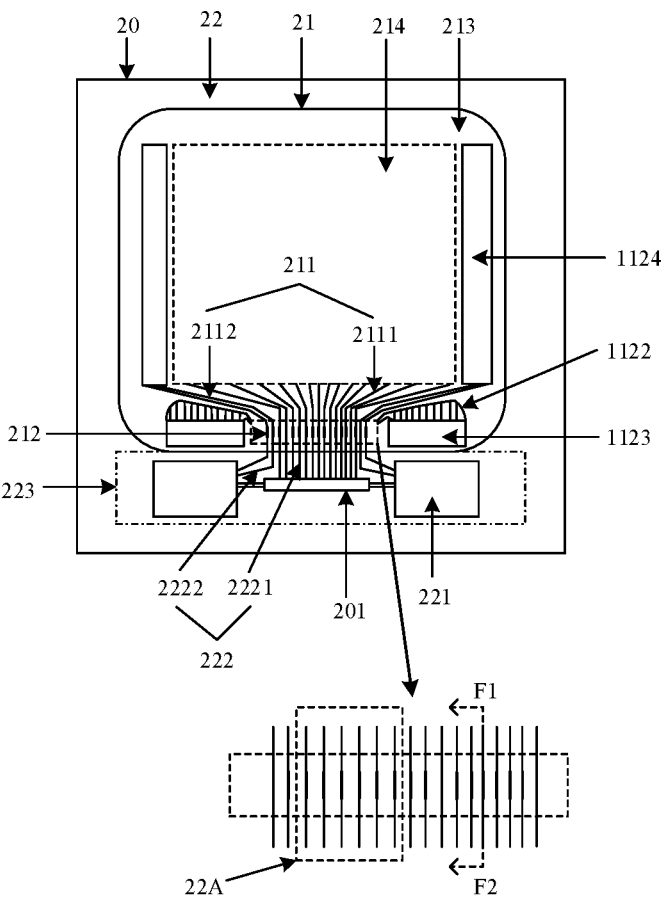
FIG. 9 is a schematic structural diagram of a display panel motherboard according to some embodiments of the present disclosure.
Figure 10:
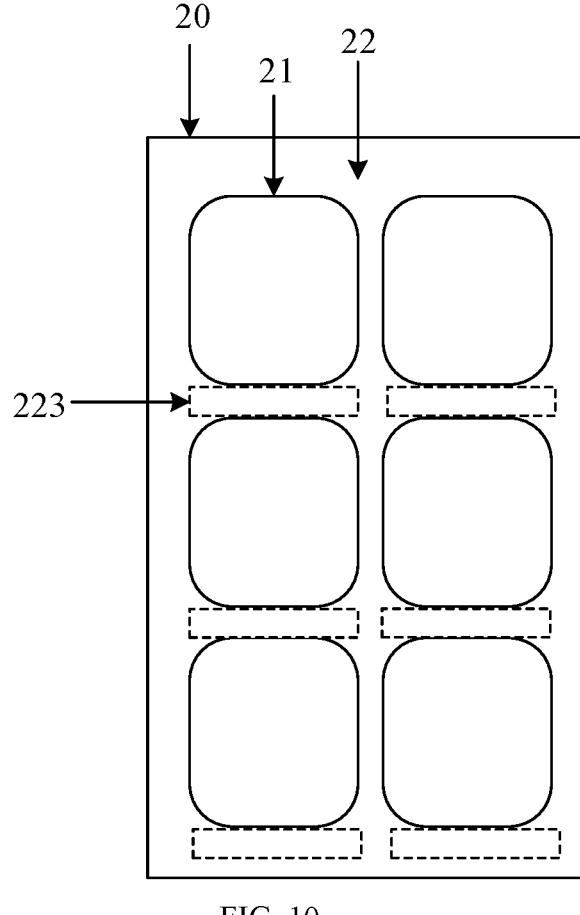
FIG. 10 is a schematic structural diagram of another display panel motherboard according to some embodiments of the present disclosure.

FIG. 9 is a schematic structural diagram of a display panel motherboard according to some embodiments of the present disclosure. As shown in FIG. 10, the display panel motherboard 20 includes at least one display panel 21, and a to-be-cut plate 22 disposed outside the display panel 21.

The display panel 21 is any display panel of the above embodiments. The display panel 21 includes a driver circuit (not shown in FIG. 2), at least one to-be-detected line 211, and at least one conductive line 212 in one-to-one correspondence with the at least one to-be-detected line 211. The display panel 21 is provided with an active area 214 and a peripheral region 213 surrounding the active area 214, and the driver circuit is disposed on the active area 214 and the peripheral region 213 of the display panel 21.

As shown in FIG. 3, any to-be-detected line 211 in the at least one to-be-detected line 211 includes a first sub-line s1 and a second sub-line s2 arranged separating from each other. The first sub-line s1 is electrically connected to the driver circuit 215 and a conductive line 212 corresponding to any to-be-detected line 211 respectively. One end s21 of the second sub-line s2 is electrically connected to the corresponding conductive line 212.

As shown in FIG. 9, the to-be-cut plate 22 is provided with a detection unit 221 and at least one detection line 222 electrically connected to the detection unit 221, the at least one detection line 222 is in one-to-one correspondence with the at least one to-be-detected line 211, and another end of the second sub-line is electrically connected to the detection line 222 corresponding to any to-be-detected line 211. The detection unit 221 is configured to perform defect detection on the display panel motherboard 20.

The at least one detection line 222 and a source-drain metal pattern are located at the same layer, or the at least one detection line 222 and a gate metal pattern are located at the same layer.

In the subsequent steps of manufacturing the display panel 21, the to-be-cut plate 22 of the display panel motherboard 20 is cut off to acquire the display panel 21. Upon cutting of the display panel motherboard 20 along the edge of the display panel 21, as another end of the second sub-line is electrically connected to the detection line 222 corresponding to any to-be-detected line 211, and the detection line 222 is cut off along with the to-be-cut plate 22, another end of the second sub-line is exposed out of the edge of the display panel 21.

The conductive line is not easy to corrode, such that corrosion caused by the second sub-line exposed out of the edge of the display panel can be prevented from extending to the inside of the display panel.

In summary, the display panel motherboard is provided in the embodiments of the present disclosure. The display panel motherboard includes the at least one display panel and the to-be-cut plate disposed outside the display panel. The display panel includes the driver circuit, the at least one to-be-detected line, and the at least one conductive line in one-to-one correspondence with the at least one to-be-detected line. Each of the at least one to-be-detected line, the to-be-detected line includes the first sub-line and the second sub-line arranged separating from each other, and another end of the second sub-line is exposed out of the edge of the display panel. The second sub-line is configured to be electrically connected to the detection unit outside the display panel prior to cutting of the display panel motherboard. Therefore, the display panel is electrically connected to the detection unit outside the display panel through the second sub-line, such that defect detection is performed on the display panel, and the first sub-line and the second sub-line in the to-be-detected line are electrically connected through the conductive line. The conductive line can prevent corrosion of the second sub-line exposed out of the edge of the display panel from extending to the inside of the display panel. The problem that display panels with faults are difficult to detect in the related art can be solved, and the detection effect of the display panel is improved.

Optionally, as shown in FIG. 10, FIG. 10 is a schematic structural diagram of another display panel motherboard according to some embodiments of the present disclosure. In the process of manufacturing the display panels 21, due to the requirement of a cutting process of the display panel motherboard 20, dummy bar regions 223 need to be arranged between the display panels 21, the dummy bar regions 223 are disposed in the to-be-cut plate 22, and a width of each dummy bar region 223 is 3 mm. A detection unit 221 in the embodiments of the present disclosure is placed on the dummy bar regions, such that the space on the display panel motherboard 20 is prevented from being additionally occupied, and the utilization rate of the display panel motherboard 20 can be improved.

In an alternative implementation, as shown in FIG. 9, the at least one detection line 222 includes a first detection line 2221, the first detection line 2221 corresponds to the first to-be-detected line 2111, and the first to-be-detected line 2111 includes a data line. The first detection line 2221 and the source-drain metal pattern are located at the same layer.

The display panel motherboard 20 further includes a switch unit 201, the first detection line 2221 is electrically connected to the switch unit 201, and the switch unit 201 is electrically connected to the detection unit 221 through a plurality of signal lines.

The at least one detection line 222 includes a second detection line 2222, the second detection line 2222 corresponds to a second to-be-detected line 2112, and the second to-be-detected line 2112 includes a gate driver signal line. The second detection line 2222 is electrically connected to the detection unit 221. The second detection line 2222 and the gate metal pattern are located at the same layer.

Figure 11:
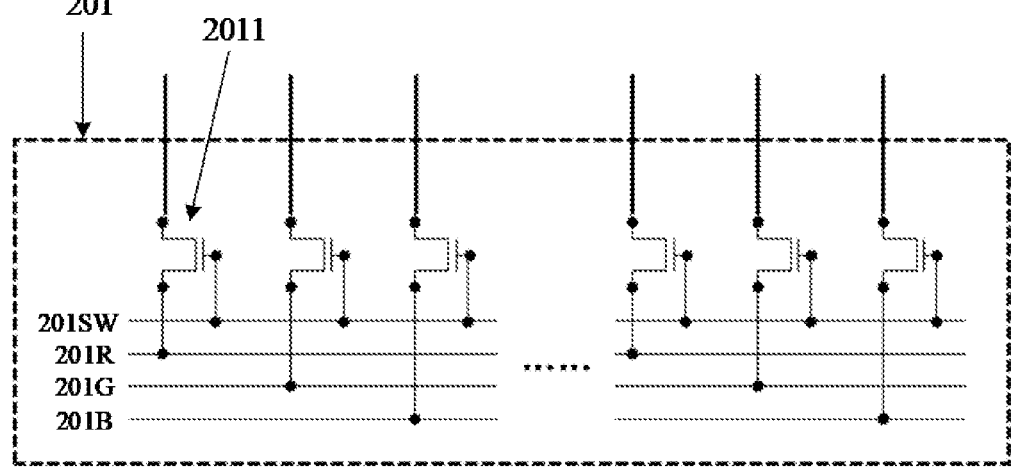
FIG. 11 is a schematic diagram of a switch unit according to some embodiments of the present disclosure.

Exemplarily, as shown in FIG. 11, FIG. 11 is a schematic diagram of a switch unit according to some embodiments of the present disclosure. In the case that colors of pixel units on the display panel include three colors of pixel units of red, green, and blue, the switch unit 201 includes a Data Red (DR) 201R, a Data Green (DG) 201G, a Data Blue (DB) 201B, and a switch (SW) signal line 201SW. The switch unit 201 includes a plurality of transistors 2011, and gates of the plurality of transistors 2011 are connected to the switch signal line 201SW to form a control terminal of the switch unit 201. First electrodes of the plurality of transistors 2011 are connected to the Data Red 201R, the Data Green 201G, and the Data Blue 201B, so as to form input terminals of the switch unit 201, and second electrodes of the plurality of transistors 2011 are connected to the first detection line 2221, so as to form output terminals of the switch unit 201. The input terminals of the switch unit 201 are configured to receive data signals output by the detection unit 221, and the output terminals of the switch unit are configured to output the data signals to the first detection line 2221. In the case that the control terminal of the switch unit receives an effective switch signal, the input terminals of the switch unit are conducted with the output terminals of the switch unit.

Optionally, as shown in FIG. 9, the switch unit 201 is disposed in the to-be-cut plate 22. In the subsequent manufacturing process of the display panel motherboard, another end of the second sub-line in the first to-be-detected line is electrically connected to the first detection line 2221, and the first detection line 2221 and the switch unit 201 are cut off together with the to-be-cut plate 22, such that another end of the second sub-line in the first to-be-detected line is exposed out of the edge of the display panel 21. The conductive line is not easy to corrode, such that corrosion caused by the second sub-line exposed out of the edge of the display panel can be prevented from extending to the inside of the display panel.

Figure 12:
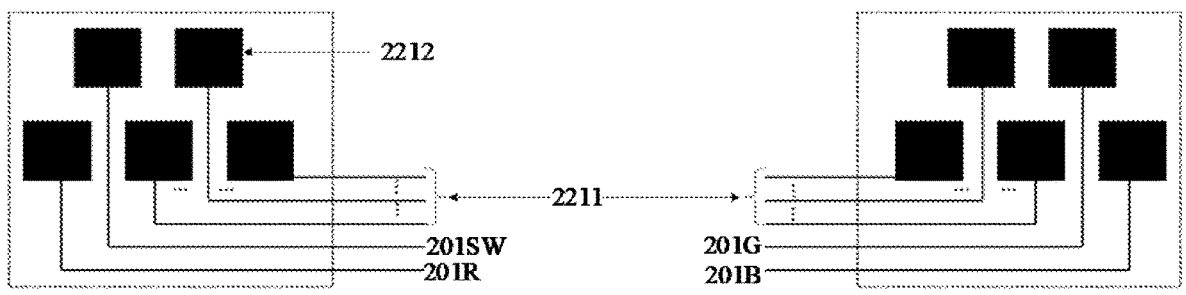
FIG. 12 is a schematic structural diagram of a detection unit according to some embodiments of the present disclosure.

As shown in FIG. 12, FIG. 12 is a schematic structural diagram of a detection unit according to some embodiments of the present disclosure. The detection unit 221 includes a plurality of ET pads 2212. The ET pads 2212 are configured to receive detection signals and transmit the detection signals to the switch unit through the Data Red 201R, the Data Green, the Data Blue 201B, and the switch signal line 201SW, and transmit the detection signals to a gate driver on array through a plurality of gate drive signal lines 2211.

Figure 13:
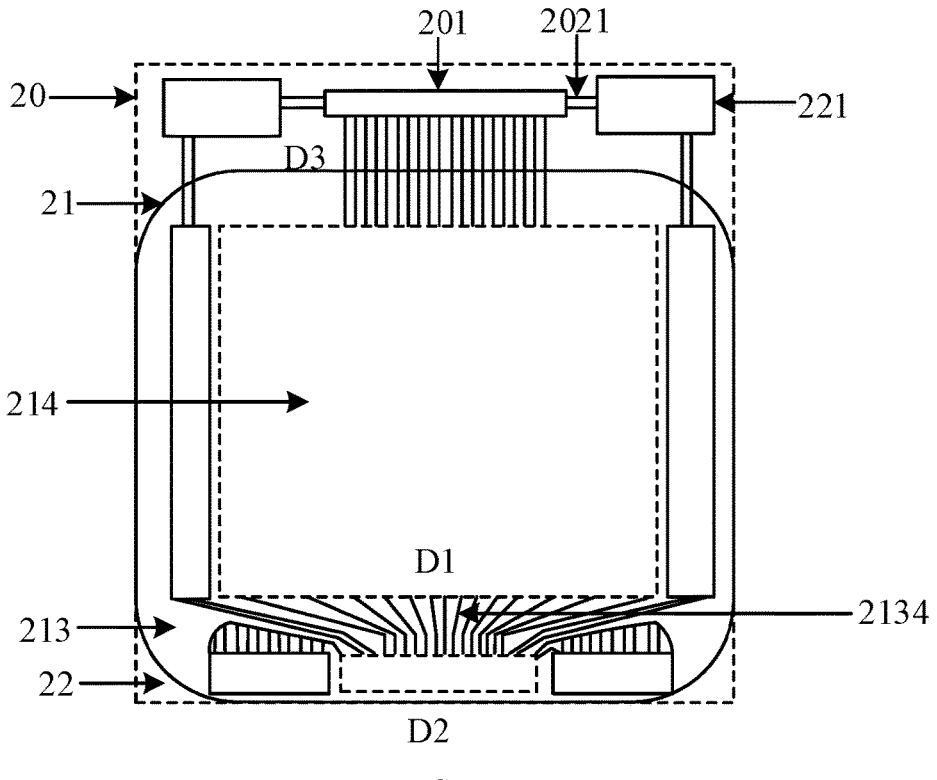
FIG. 13 is a schematic structural diagram of another display panel motherboard according to some embodiments of the present disclosure.

Optionally, as shown in FIG. 13, FIG. 13 is a schematic structural diagram of another display panel motherboard according to some embodiments of the present disclosure. The display panel 21 is provided with an active area 214 and a peripheral region 213 surrounding the active area 214, and a fanout region 2134 is provided in the peripheral region 213 between a first edge D1 of the active area 214 and a second edge D2 of the display panel 21. A switch unit 201 and a detection unit 221 are disposed in the to-be-cut plate 22 outside a third edge D3 of the display panel 21, and the third edge D3 is an edge opposite to the second edge D2. That is, the switch unit 201 and the detection unit 221 are disposed on one side where a data pad offside (DO) of the display panel is disposed. The switch unit 201 is electrically connected to the detection unit 221 through a plurality of signal lines 2012. The switch unit 201 is connected to a to-be-detected line in the display panel through a plurality of detection lines. The connection manner of the to-be-detected line and the conductive line in the display panel in FIG. 13 is the same as the connection manner on the display panel shown in FIG. 2, which is not repeated in the embodiments of the present disclosure. Upon cutting of the to-be-cut plate, the corrosion caused by the exposure of another end of the second sub-line at the edge of the display panel can be prevented from extending to the inside of the display panel. In addition, the peripheral region 213 of the display panel is covered with a frame sealing adhesive in the subsequent manufacturing process of the display panel for packaging a frame of the display panel, and the conductive line is disposed under the frame sealing adhesive, such that corrosion caused by exposure of the via holes under the conductive line can be avoided.

Alternatively, as shown in FIG. 9, the switch unit 201 and the detection unit 221 are disposed in the to-be-cut plate 22 outside the second edge of the display panel 21. That is, the switch unit 201 and the detection unit 221 are disposed on one side where a data pad (DP) of the display panel is disposed. Therefore, the wiring length of the to-be-detected line can be reduced, and the manufacturing process is saved.

Figures 14, 15:
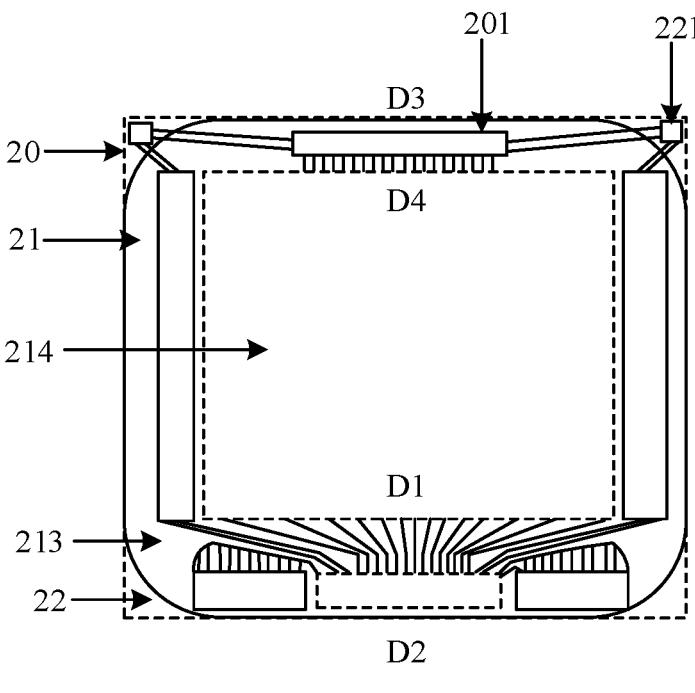
FIG. 14 is a schematic structural diagram of another display panel motherboard according to some embodiments of the present disclosure.
FIG. 15 is a schematic structural diagram of another display panel motherboard according to some embodiments of the present disclosure.

Optionally, as shown in FIG. 14, FIG. 14 is a schematic structural diagram of another display panel motherboard according to some embodiments of the present disclosure. A switch unit 201 is disposed in the peripheral region 213 outside a fourth edge D4 of the active area 214, and the fourth edge D4 is an edge opposite to the first edge D1. A detection unit 221 is disposed in the to-be-cut plate 22 outside both ends of the third edge D3. Therefore, an area of the to-be-cut plate on the display panel motherboard can be saved, and the utilization rate of the display panel motherboard is improved. The detection unit 221 is a miniaturized detection unit. Exemplarily, the detection unit is a flexible printed circuit type detection unit. In the embodiments of the present disclosure, the switch unit 201 is disposed on one side where a data pad offside of the display panel 21 is disposed, the display panel motherboard 20 is cut into a square panel in the case of detecting the display panel 21, and at this moment, the display panel motherboard includes the detection unit, configured to perform defect detection on the display panel 21. Upon detection, the display panel motherboard is cut, the to-be-cut plate 22 is cut off, and the detection unit 221 is cut off along with the to-be-cut plate 22. The switch unit 201 is retained in the peripheral region 213 of the display panel 21, and the switch signal lines in the switch unit 201 are configured to receive a v gate low (VGL) signal, such that the switch unit 201 is in a closed state, and the switch unit 201 is prevented from transmitting an electrical signal to the active area 214 of the display panel 21.

Optionally, as shown in FIG. 15, FIG. 15 is a schematic structural diagram of another display panel motherboard according to some embodiments of the present disclosure. The detection unit 221 includes two detection sub-units (221A and 221B), and the two detection sub-units (221A and 221B) are respectively disposed in the to-be-cut plate 22 outside both ends of the second edge D2. Therefore, an area of the to-be-cut plate on the display panel motherboard can be saved, and the utilization rate of the display panel motherboard is improved.

In summary, the display panel motherboard is provided in the embodiments of the present disclosure. The display panel motherboard includes the at least one display panel and the to-be-cut plate disposed outside the display panel. The display panel includes the driver circuit, the at least one to-be-detected line, and the at least one conductive line in one-to-one correspondence with the at least one to-be-detected line. Each of the at least one to-be-detected line, the to-be-detected line includes the first sub-line and the second sub-line arranged separating from each other, and another end of the second sub-line is exposed out of the edge of the display panel. The second sub-line is configured to be electrically connected to the detection unit outside the display panel prior to cutting of the display panel. Therefore, the display panel is electrically connected to the detection unit outside the display panel through the second sub-line, such that defect detection is performed on the display panel, and the first sub-line and the second sub-line in the to-be-detected line are electrically connected through the conductive line. The conductive line can prevent corrosion of the second sub-line exposed out of the edge of the display panel from extending to the inside of the display panel. The problem that display panels with faults are difficult to detect in the related art can be solved, and the detection effect of the display panel is improved.

It should be noted that, in the drawings, the sizes of the layers and regions may be exaggerated for clarity of illustration. Also, it can be understood that, in a case that an element or layer is referred to as being "on" another element or layer, it may be directly on the other element, or an intermediate layer may be present. In addition, it can be understood that, in a case that an element or layer is referred to as being "under" another element or layer, it may be directly under the other element, or one or more intermediate layers or elements may be present. In addition, it can also be understood that, in a case that a layer or element is referred to as being "between" two layers or elements, it may be the only layer between the two layers or elements, or one or more intermediate layers or elements may also be present. Like reference numerals refer to like elements throughout the present disclosure.

In the present disclosure, the terms "first", "second", "third", "fourth", "fifth", "sixth", "seventh", "eighth", "ninth", "tenth", and "eleventh" are used for descriptive purposes only and are not to be construed as indicating or implying relative importance. The term "a plurality of" refers to two or more, unless otherwise explicitly defined.

Described above are merely optional embodiments of the present disclosure and are not intended to limit the present disclosure. Any modifications, equivalents, improvements, and the like, made within the spirit and principle of the present disclosure should fall within the protection scope of the present disclosure.

What is claimed is:

1. A display panel, comprising a driver circuit, at least one to-be-detected line, and at least one conductive line in one-to-one correspondence with the at least one to-be-detected line; wherein each of the at least one to-be-detected line comprises a first sub-line and a second sub-line arranged separating from each other, wherein the first sub-line is electrically connected to the driver circuit and a conductive line corresponding to the to-be-detected line respectively, one end of the second sub-line is electrically connected to the conductive line corresponding to the to-be-detected line, and another end of the second sub-line is exposed out of an edge of the display panel; and wherein the second sub-line is configured to be electrically connected to a detection unit outside the display panel prior to cutting of a display panel motherboard comprising the display panel.

2. The display panel according to claim 1, wherein the conductive line and the first sub-line are located at different layers, and the conductive line and the second sub-line are located at different layers.

3. The display panel according to claim 2, wherein the display panel comprises a base substrate and a first insulating layer disposed on the base substrate; and the at least one to-be-detected line comprises a first to-be-detected line, the at least one conductive line comprises a first conductive line, wherein the first to-be-detected line and the first conductive line are disposed on two sides of the first insulating layer respectively, a first sub-line and a second sub-line in the first to-be-detected line are located at a same layer, the first sub-line in the first to-be-detected line is electrically connected to the first conductive line through a first via hole in the first insulating layer, and the second sub-line in the first to-be-detected line is electrically connected to the first conductive line through a second via hole in the first insulating layer.

4. The display panel according to claim 3, wherein the first to-be-detected line is disposed between the first insulating layer and the base substrate, and the first conductive line is disposed on one side, distal from the base substrate, of the first insulating layer.

5. The display panel according to claim 4, wherein the display panel further comprises a second insulating layer, wherein the second insulating layer is disposed between the first insulating layer and the base substrate;

the at least one to-be-detected line further comprises a second to-be-detected line, wherein the second to-be-detected line is disposed between the second insulating layer and the base substrate; and a first sub-line and a second sub-line in the second to-be-detected line are located at a same layer, the first conductive line is electrically connected to the first sub-line in the second to-be-detected line through a third via hole in the first insulating layer and the second insulating layer, and the first conductive line is electrically connected to the second sub-line in the second to-be-detected line through a fourth via hole in the first insulating layer and the second insulating layer.

6. The display panel according to claim 5, wherein the first conductive line is electrically connected to the first sub-line of the second to-be-detected line through the first insulating layer and at least two second target via holes in the second insulating layer.

7. The display panel according to claim 4, wherein the display panel further comprises a second insulating layer, wherein the second insulating layer is disposed between the first insulating layer and the base substrate;

the at least one to-be-detected line further comprises a second to-be-detected line, wherein the second to-be-detected line is disposed between the second insulating layer and the base substrate, a first sub-line and a second sub-line in the second to-be-detected line are at a same layer;

the to-be-detected line further comprises a first transfer line and a second transfer line arranged separating from each other, wherein the first transfer line is disposed between the first insulating layer and the second insulating layer, the first transfer line is electrically connected to the first sub-line in the second to-be-detected line through a fifth via hole in the second insulating layer, and the first transfer line is electrically connected to the first conductive line through a sixth via hole in the first insulating layer; and the second transfer line is electrically connected to the second sub-line in the second to-be-detected line through a seventh via hole in the second insulating layer, and the second transfer line is electrically connected to the first conductive line through an eighth via hole in the first insulating layer.

8. The display panel according to claim 4, wherein the display panel further comprises a second insulating layer, wherein the second insulating layer is disposed between the first insulating layer and the base substrate;

the at least one to-be-detected line further comprises a second to-be-detected line, wherein the second to-be-detected line is disposed between the second insulating layer and the base substrate, and a first sub-line and a second sub-line in the second to-be-detected line are located at a same layer; and the at least one conductive line further comprises a second conductive line, wherein the second conductive line is disposed on one side, distal from the base substrate, of the second insulating layer, and the second conductive line is electrically connected to the first sub-line in the second to-be-detected line through a ninth via hole in the second insulating layer and is also electrically connected to the second sub-line in the second to-be-detected line through a tenth via hole in the second insulating layer.

9. The display panel according to claim 8, wherein a material of the second conductive line comprises a transparent non-metallic conductive material.

10. The display panel according to claim 4, wherein a material of the first conductive line comprises a transparent non-metallic conductive material.

11. The display panel according to claim 10, wherein the display panel comprises a pixel electrode, wherein the first conductive line and the pixel electrode are located at a same layer.

12. The display panel according to claim 3, wherein the first conductive line is electrically connected to the first sub-line in the first to-be-detected line through at least two first target via holes in the first insulating layer.

13. A display panel motherboard, comprising at least one display panel and a to-be-cut plate disposed outside the display panel; wherein the display panel comprises a driver circuit, at least one to-be-detected line, and at least one conductive line in one-to-one correspondence with the at least one to-be-detected line;

each of the at least one to-be-detected line comprises a first sub-line and a second sub-line arranged separating from each other, wherein the first sub-line is electrically connected to the driver circuit and a conductive line corresponding to the to-be-detected line respectively, and one end of the second sub-line is electrically connected to the conductive line corresponding to the to-be-detected line; and the to-be-cut plate is provided with a detection unit and at least one detection line electrically connected to the detection unit, wherein the at least one detection line is in one-to-one correspondence with the at least one to-be-detected line, and another end of the second sub-line is electrically connected to a detection line corresponding to the to-be-detected line.

14. The display panel motherboard according to claim 13, wherein the display panel comprises a base substrate and a first insulating layer disposed on the base substrate;

the at least one to-be-detected line comprises a first to-be-detected line, the at least one conductive line comprises a first conductive line, wherein the first to-be-detected line and the first conductive line are disposed on two sides of the first insulating layer respectively, a first sub-line and a second sub-line in the first to-be-detected line are located at a same layer, the first sub-line in the first to-be-detected line is electrically connected to the first conductive line through a first via hole in the first insulating layer, and the second sub-line in the first to-be-detected line is electrically connected to the first conductive line through a second via hole in the first insulating layer;

the at least one detection line comprises a first detection line, wherein the first detection line corresponds to the first to-be-detected line, and the first to-be-detected line comprises a data line; and the display panel motherboard further comprises a switch unit, wherein the first detection line is electrically connected to the switch unit, and the switch unit is electrically connected to the detection unit.

15. The display panel motherboard according to claim 14, wherein the switch unit is disposed in the to-be-cut plate.

16. The display panel motherboard according to claim 15, wherein the display panel is provided with an active area and a peripheral region surrounding the active area, and a fanout region is provided in the peripheral region between a first edge of the active area and a second edge of the display panel; and the switch unit and the detection unit are disposed in the to-be-cut plate outside a third edge of the display panel, wherein the third edge is an edge opposite to the second edge.

17. The display panel motherboard according to claim 15, wherein the display panel is provided with an active area and a peripheral region surrounding the active area, and a fanout region is provided in the peripheral region between a first edge of the active area and a second edge of the display panel; and the switch unit and the detection unit are disposed in the to-be-cut plate outside the second edge of the display panel.

18. The display panel motherboard according to claim 14, wherein the display panel is provided with an active area and a peripheral region surrounding the active area, wherein the peripheral region outside a first edge of the active area is provided with a fanout region, the switch unit is disposed in the peripheral region outside a fourth edge of the active area, wherein the fourth edge is an edge opposite to the first edge.

19. The display panel motherboard according to claim 14, wherein the display panel is provided with an active area and a peripheral region surrounding the active area, and a fanout region is provided in the peripheral region between a first edge of the active area and a second edge of the display panel; and the detection unit comprises two detection sub-units, wherein the two detection sub-units are respectively disposed in the to-be-cut plate outside two ends of a second edge of the display panel.

20. The display panel motherboard according to claim 13, wherein the display panel further comprises a second insulating layer, wherein the second insulating layer is disposed between the first insulating layer and the base substrate;

the at least one to-be-detected line further comprises a second to-be-detected line, wherein the second to-be-detected line is disposed between the second insulating layer and the base substrate;

a first sub-line and a second sub-line in the second to-be-detected line are located at a same layer, the first conductive line is electrically connected to the first sub-line in the second to-be-detected line through a third via hole in the first insulating layer and the second insulating layer, and the first conductive line is electrically connected to the second sub-line in the second to-be-detected line through a fourth via hole in the first insulating layer and the second insulating layer;

the at least one detection line comprises a second detection line, wherein the second detection line corresponds to the second to-be-detected line, and the second to-be-detected line comprises a gate driver signal line; and the second detection line is electrically connected to the detection unit.

\* \* \* \* \*